United States Patent [19]

Bush et al.

[11] Patent Number: 5,014,276

[45] Date of Patent: May 7, 1991

[54] CONVOLUTIONAL ENCODER AND SEQUENTIAL DECODER WITH PARALLEL ARCHITECTURE AND BLOCK CODING PROPERTIES

[75] Inventors: Aubrey M. Bush, Atlanta; John F. Schimm, Jr., Norcross, both of Ga.

[73] Assignee: Scientific Atlanta, Inc., Atlanta, Ga.

[21] Appl. No.: 572,461

[22] Filed: Aug. 27, 1990

Related U.S. Application Data

[63] Continuation of Ser. No. 307,170, Feb. 6, 1989, abandoned, which is a continuation of Ser. No. 72,639, Jul. 13, 1987, abandoned.

[51] Int. Cl.$^5$ .............................................. G06F 11/10
[52] U.S. Cl. ..................... 371/43; 371/37.4; 371/41
[58] Field of Search .............. 371/37.1, 37.4, 38.1, 371/39.1, 41, 43, 44, 45, 5.1, 5.5

[56] References Cited

U.S. PATENT DOCUMENTS

| | | | |
|---|---|---|---|
| 3,078,443 | 2/1963 | Rose | 371/41 |
| 3,988,677 | 10/1976 | Fletcher | 371/37 X |
| 4,038,636 | 7/1977 | Doland | 371/37 |
| 4,159,469 | 6/1979 | Zdunek | 371/43 |
| 4,179,710 | 12/1979 | Ishiguro et al. | 358/135 |
| 4,240,156 | 12/1980 | Doland | 371/37 X |
| 4,312,070 | 1/1982 | Coombes | 371/42 X |
| 4,375,581 | 3/1983 | Jayant | 179/15.55 R |
| 4,464,714 | 8/1984 | Huijser et al. | 364/200 |
| 4,496,934 | 1/1985 | Furukawa | 340/347 DD |
| 4,502,036 | 2/1985 | Furukawa | 340/347 DD |
| 4,503,420 | 3/1985 | Rub et al. | 340/347 DD |
| 4,563,671 | 1/1986 | Lim et al. | 340/347 DD |
| 4,581,601 | 2/1986 | Calderbank | 340/347 DD |
| 4,747,104 | 5/1988 | Piret | 371/44 X |

OTHER PUBLICATIONS

S. Lin, "An Introduction to Error-Correcting Codes", 1970, pp. 311-319.
W. Peterson, "Error-Correcting Codes", 1972, pp. 6-10 and 412-425.
Massey, J. L., "Variable-Length Codes and the Fayo Metric", *IEEE Trans. Inf. Theory*, IT-18, Jan. 1972, pp. 196-198.
*Error-Correction Coding for Digital Communications*, Clark and Cain, Plenum Press, 1981 (pp. 297-326) (Chapts. 1-5).
Hagenauer, "High Rate Convolutional Codes with Good Distance Profiles"; *IEEE Trans. on Information Theory*, vol. IT-23, No. 5, Sep. 1977, pp. 615-618.
Morizono et al., "Digital Video Recording-Some Experiments and Future Considerations", *SMPTE Journal* (Sep. 1980), vol. 89, No. 9, pp. 658-662.

*Primary Examiner*—Jerry Smith
*Assistant Examiner*—Robert W. Beausoliel
*Attorney, Agent, or Firm*—Sterne, Kessler, Goldstein & Fox

[57] ABSTRACT

A sequential encoder/decoder pair for error correction using block and convolutionally encoded data. The encoder includes a block coder with up to t bit error correction capability and a convolutional coder, so that the block encoded bits are also convolutionally coded. The convolutional decoder includes a block decoder, which renders the convolutional decoding process more efficient by reducing the amount of computation required to correct t or fewer errors in a received block of data. Since the most likely error patterns involve the least number of bits, most of the correction is accomplished by block decoding, with only minimal use of the convolutional-encoding algorithm, thus saving valuable computation time for more complex but less likely error patterns. The decoder employs an error pattern estimator and branch metric generator to correct all error patterns using the Fano algorithm, using stored values which are derived from known probability of random errors in the data channel. The decoder feeds an encoded block of data into a replica of the convolutional encoder. The replica encoder calculates a syndrome bit pattern from the combination of the received parity together with parity data calculated using the received block and a given number of previous data blocks, i.e., calculated convolutionally. The syndrome bit can then be used to correct the received data.

18 Claims, 10 Drawing Sheets

CONVOLUTIONAL ENCODER AND SEQUENTIAL DECODER WITH PARALLEL ARCHITECTURE AND BLOCK CODING PROPERTIES

This application is a continuation of application Ser. No. 07/307,170 filed Feb. 6, 1989, which is a continuation of prior application Ser. No. 07/072,639, filed on July 13, 1987.

BACKGROUND OF THE INVENTION

1. Field of the Invention

The present invention relates to an efficient and reliable convolutional encoder and sequential decoder system which uses the properties of block codes to maximize decoding efficiency and thereby greatly increase the speed and/or coding gain over the prior art.

2Description of Related Art

Convolutional encoding and sequential decoding have received considerable attention within the communications field. The properties of the various codes and popular decoding algorithms are discussed in detail in *Error Control Coding: Fundamentals and Applications*, Lin and Costello, Prentice-Hall, 1983 (pp. 350-384).

A conventional convolutional encoder comprises K shift registers coupled to N-K parity adders. Each adder acts on a distinct subset of the bits in the shift registers. Typically, the code is systematic. The N-K outputs of the adders are loaded into a parallel-to-serial register along with K successive data bits. This N-bit word is then transmitted in serial form. These N symbols form one "branch" of a "tree code" which is generated. For transmission purposes, the convolutionally encoded data is organized into packets. This packet of encoded data then becomes the initial state for the encoding of the next block of data.

Systematic convolutional encoding inserts parity bits into the information bit stream. The code words in the conventional convolutional code can be arranged in the form of a tree structure, and the encoder selects a path through the tree corresponding to the data to be encoded. Sequential decoding can accordingly be regarded as the process of determining the path in the tree which was followed by the encoder. As the decoder reconstructs the encoder's path through the tree based upon the received sequence, it compares the probability of the path that it is currently exploring against a threshold. The probability of a path is stored in the decoder as the "path metric". When the comparison is favorable, the decoder continues forward on the decoding tree. An unfavorable comparison indicates that the decoder is on the wrong path. In this event the decoder changes direction and searches a different portion of the tree.

A conventional sequential decoder for such a code comprises a buffer memory to hold the received data, a functional "copy" of the encoder, and associated equipment to measure the merit of the output of the encoder relative to the received data, that is, the accuracy of the decoding process. This can be performed as described in Massey, J.L., "Variable-Length Codes and the Fano Metric", *IEEE Trans. Inf. Theory*, IT-18, pp. 196-198, Jan. 1972, specifically according to eq. (5) on p. 198. The resulting "metric of merit" is used sequentially to estimate errors and correct the data sequence. The "branch metric" is computed branch by branch of the coding tree; the running sum of all branch metrics is called the "path metric", which is compared to a threshold. Whenever a threshold violation is found, the received data is searched backward for the probable cause and then corrected.

This estimation and backward searching can be controlled according to the well-known Fano algorithm. See *Error-Correction Coding for Digital Communications*, Clark and Cain, Plenum Press, 1981 (pp. 297-326). According to the Fano algorithm, and as suggested above, information bits and parity bits are transmitted, are to some degree corrupted in the channel by noise, and then are detected by the receiver. The receiver regenerates parity bits from the corrupted information bits and compares the regenerated parity bits with the received parity bits, generating the so-called "syndrome" bits. The branch metric, that is, a measure of the probability of the received sequence, is computed for each branch according to the formulas in Massey, supra. The branch metric is greater for higher probability received vectors, i.e., ones with fewer errors. A running sum of these branch metrics is compared with an adaptive threshold. Where the running sum drops below the current threshold, the detection process ceases to go forward and is reversed to re-examine the values for assumed previous information bits, until a sequence of information bits which results in an increasingly positive running sum value is obtained. The adaptive threshold is adjusted following the rules of the modified Fano algorithm.

Conventional sequential decoders can thus provide effective correction for communication errors. However, due to channel noise and other transmission path conditions, errors often cause a conventional sequential decoder to do an enormous amount of searching, which can result in the decoder simply running out of time to decode all the received information. Resynchronization of the decoder is then required. During this process, the decoder is unable to correct a quantity of data, which is lost.

Block coding is also employed in data communication arrangements. In such systems, a group of K information bits is algebraically manipulated according to a particular coding scheme (e.g. a Hamming code) to yield a number of additional bits which together with the original bits or some permutation of them make up an N-bit block. N is thus always greater than K, and the code is referred to as an K/N code. The additional bits provide redundant information which can be used to decode a limited number of errors in the received blocks. See the Clark and Cain reference mentioned above (Ch. 1-5) for a full discussion of block coding.

Block coding is distinguished from convolutional coding as discussed above in that convolutional codes use a sliding window of memory (i.e., data is encoded according to the preceding data) while the block encoder memory window advances one block at a time (i.e., data blocks are treated individually).

As far as known by the present inventors the properties and structures of both convolutional and block codes have not previously been integrated into a single code and employed on data streams.

SUMMARY OF THE INVENTION

The encoder according to the present invention encodes the data such that parity bits are generated simultaneously by a convolutional code and a block code. This hybrid code is constructed in the following manner. The contributions to the parity word from the first column of the parallel shift registers which define the overall code are determined by the generator matrix of a block code. The contributions from the subsequent columns are determined by the best distance profile of a convolutional code, which is the result of an exhaustive computer search. Thus the code may be viewed either as a convolutional code with an embedded block code, or as a block code which has been extended convolutionally.

At the decoder, block code error detection and correction is performed as the first step of the convolutional decoding process in the decoder. The most likely error pattern is a single bit error. A two-bit error pattern is less likely, and so on. The block code property of the decoder corrects up to a t-bit error pattern with only minimal employment of the Fano algorithm (where t depends on the specific block code). Thus valuable computation time is saved for more complex but less likely error patterns, which are corrected using the convolutional properties of the code. During the added time thus made available, the decoder can more thoroughly correct the errors in the received data stream. This added time for the decoder to operate provides increased coding gain and/or operation at higher bit rates than otherwise.

Where more than t errors are present in a block, the decoder attempts to correct these using the Fano algorithm as modified by Gallager. See Clark and Cain, supra. More specifically, the decoder of the present invention utilizes an error pattern estimator and branch metric generator which contains a table of likelihood values derived from known error statistics about a data channel. The decoder enters a received encoded block of data into a replica of the convolutional encoder and then calculates a parity word from the combination of the presently received data block together with a given number of previously transmitted blocks stored in memory. This reconstructed parity word is added modulo-2 to the received parity word, resulting in the syndrome word. This syndrome word indicates whether the current assumption of the path through the convolutional tree is correct.

When no error is found by the decoder, the syndrome word is all zeros, indicating that the correct path in the coding tree has been taken. If an error is detected, the non-zero syndrome word is employed to partially address an error table of possible error patterns and branch metric values. The remaining address bits are taken from the soft-decision, or quality bits, and from the current contents of an index register. This branch metric value is used to update a total path metric value in the decoder of the present invention. The error pattern value is then used to correct the current received data word.

BRIEF DESCRIPTION OF THE DRAWINGS

The invention will be better understood if reference is made to the accompanying drawings in which:

FIG. 5b is a timing diagram for the timing management unit of FIG. 5a;

DETAILED DESCRIPTION OF THE PREFERRED EMBODIMENT

Figure 1:
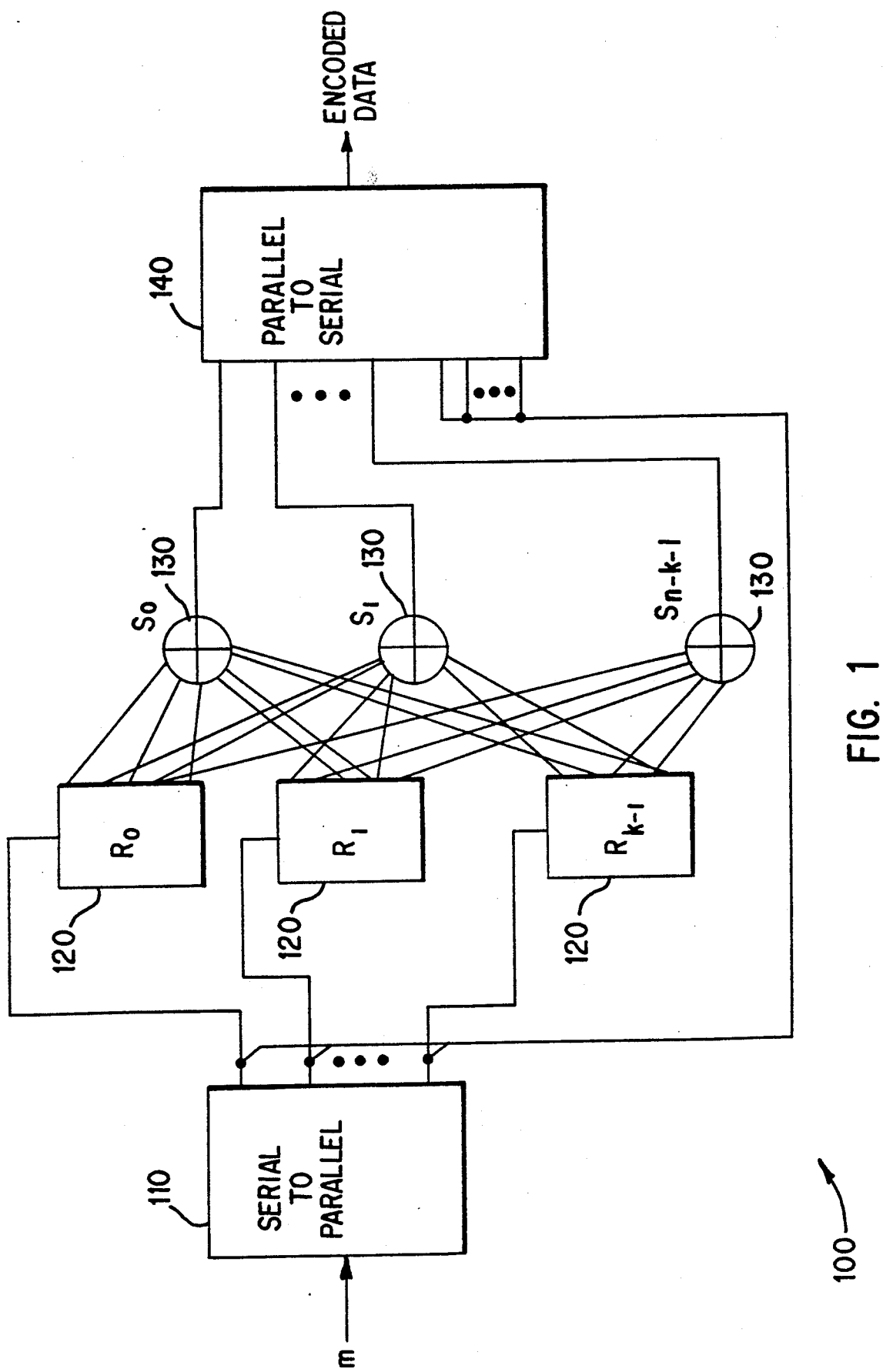
FIG. 1 is an overall block diagram of a rate k/n convolutional encoder according to the present invention.

FIG. 1 shows a block diagram of a convolutional encoder 100 according to the invention, comprising a serial to parallel converter 110, shift registers 120, modulo-2 summers (i.e., parity generators) 130, and a parallel to serial converter 140. This encoder can be used to encode data prior to transmission via a satellite channel. The encoder is shown for rate k/n where k is the number of information bits, i.e., of serial customer data supplied to serial-to-parallel converter 110, which are contained in each group of n bits that are transmitted. k shift registers 120 are required, which are labelled $R_0$ through $R_{k-1}$, and (n−k) summers 130 are required, labelled $S_0$ through $S_{n-k-1}$. Each summer 130 receives as its inputs taps from each of the shift registers 120. The outputs of the summers 130 are called parity bits and are transmitted along with the information bits supplied by the customers. Each group of n data bits transmitted is related to the neighboring groups by the nature of convolutional codes. This is in contrast to a block code in which each block is independent of all others.

Figure 2:
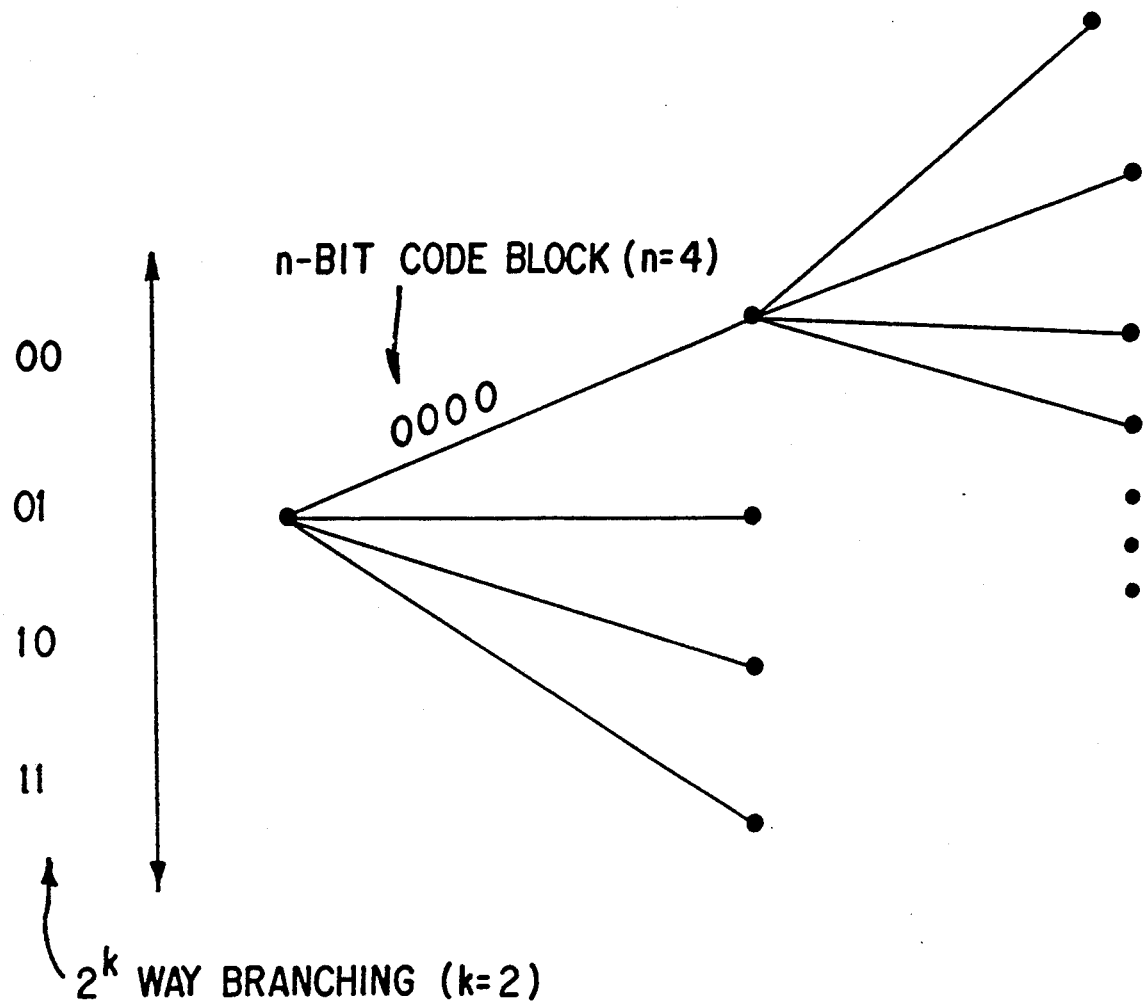
FIG. 2 shows the tree structure for a rate k/n code.

FIG. 2 shows the coding tree followed by the encoder. The tree defines a structure by which the encoded data is decoded so that errors can be corrected. As can be observed, different pathways through the tree are followed depending on the input data. That is, the tree describes the path taken through the decoding process; the path taken depends on the input data presented.

Figure 3:
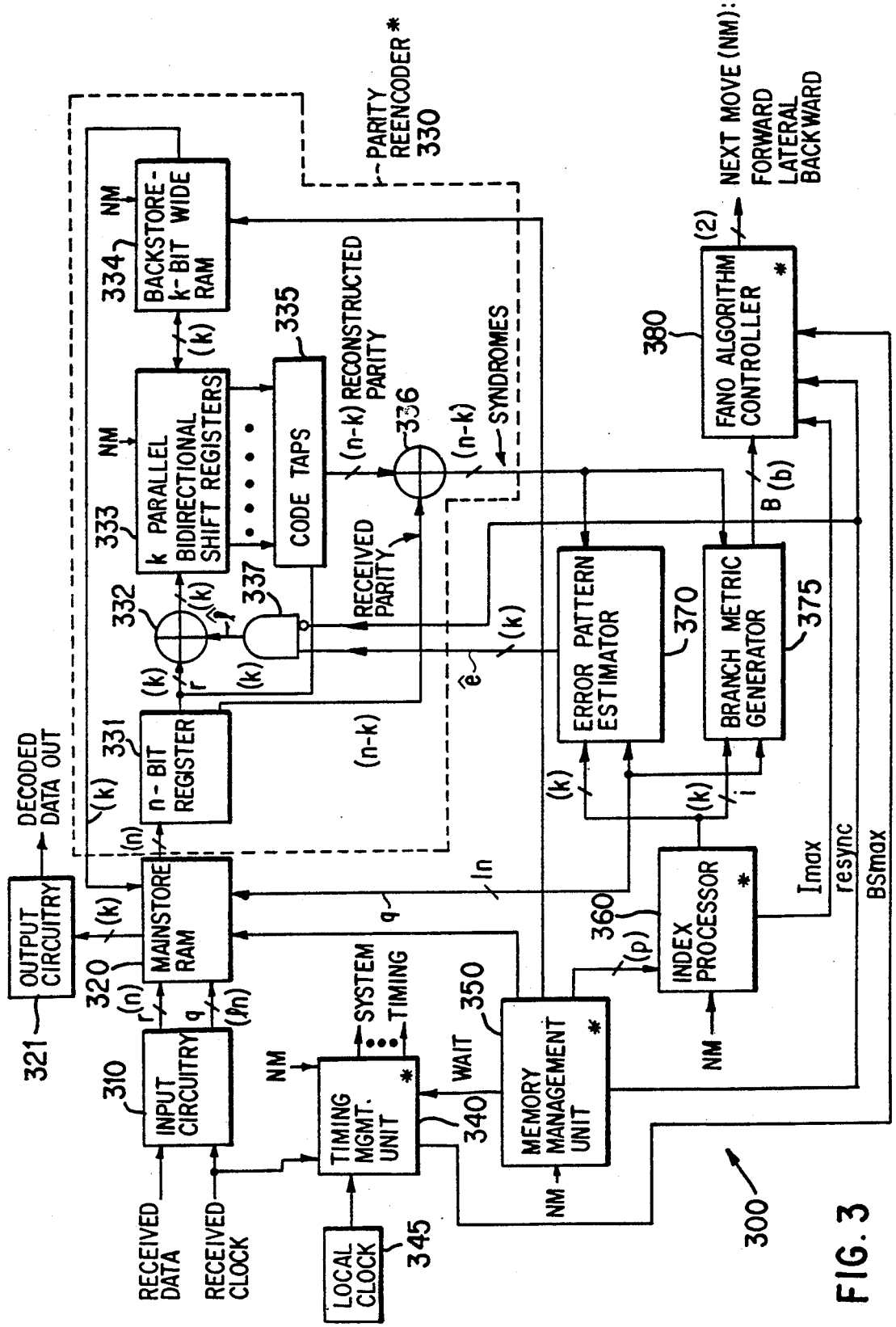
FIG. 3 is an overall block diagram of the rate k/n sequential decoder according to the present invention.

The encoded data is transmitted by conventional means, e.g., via satellite, and is then received from the satellite over a downline to a ground station for decoding by the decoder 300, the architecture of which is shown in block diagram from in FIG. 3. The functional blocks in FIG. 3 which are marked with * are detailed in FIGS. 4-8 discussed below.

Data and clock signals are received by input circuit 310. In this unit the serial data stream is converted to parallel form, and the quality (or soft-decision) bits q are separated from the sign (or information) bits r. At any time, r represents an n-bit branch of data identical to that sent by the encoder except for possible corruption by the channel. q represents a "soft" decision made at the receiver, responsive to the signal plus noise at the instant of sampling, that is, the quantized matched filter output at that instant, which indicates the relative certainty of r. The conjunction of the soft decision bits q and a parity check performed on the received data provides an indication of the number of transmission errors in a given block of data.

Both r and q are fed to mainstore 320, a RAM which acts as a circular buffer. Mainstore 320 has three functions: (1) it provides storage for r and q while processing proceeds; (2) it permits the smooth flow of corrected data to the output of the decoder; (3) it provides an interface between the bit-rate clock environment that exists outside the decoder and the process-rate clock environment that exists only inside the decoder.

Data is processed in the parity reencoder 330 as follows. r is taken out of mainstore 320 one branch at a time (i.e., k data bits and n-k parity bits), and data passes through modulo-2 summers 332 where corrections are made according to ê, an error pattern estimate. The corrected data passes through k parallel bidirectional shift registers 333, and then on to backstore 334. Backstore 334 is a circular buffer that holds tentative corrected branches from which they can be recalled into the parity reencoder 330. From backstore 334, data is returned to mainstore 320, at which point the tentative branch decision becomes final. When a "backwards" move is invoked, data flows from backstore 334 into the register 333. When a "lateral" move is invoked no action occurs in the parity reencoder 330.

At each move, that is, forward, backward or lateral, n-k parity bits are formed at the modulo-2 summers 332. The code for computing the parity bits is identical to that in the encoder. This recomputed parity then is added to the received parity at summer 336, resulting in a syndrome word. The syndrome is used to form the error pattern estimate and the branch metric B, as will be described subsequently.

Code tap unit 335 accesses the shift registers 333. n-k summers 336 generate a syndrome, that is, compare the reconstructed and received parity bits, in accordance with the block code. The block code is implemented by feeding selected ones of the k input bits from register 331 to code tap unit 335, in which they are summed with the data bits from registers 333 to generate the reconstructed parity bits. The selection of the connections which implement the block code is given by the generator matrix for the block code; see Clark and Cain, supra. The subsequent taps of block 335, which complete the definition of the convolutional code, are preferably determined by computer analysis, as set forth in Hagenauer, "High Rate Convolutional Codes with Good Distance Profiles", *IEEE Trans. on Information Theory*, Vol. IT-23, No. 5, Sept. 1977, pp. 615-618.

In effect, the convolutional decoder runs continuously; data passes through the parity reencoder 330, from mainstore 320 to register 331, to shift registers 333, to backstore 334, back to mainstore 320, and thence to the output circuitry 321. At summing nodes 332, the data is summed with the error pattern estimate responsive partially to the syndrome S to the quality bits 9, and also to the index processor 360, which locates the current location on the decoding tree. This is discussed below in further detail. Syndrome S in turn is generated in n-k summers 336, responsive to comparison of the reconstructed parity bits, which are generated in the code tap unit 335 to the received parity bits.

Thus, and as will be appreciated by those of skill in the art, the system of the invention comprises a convolutional encoder and decoder which operate using a block code. Upon decoding, the block code properties of the code enhances the convolutional decoding process.

Figure 4:
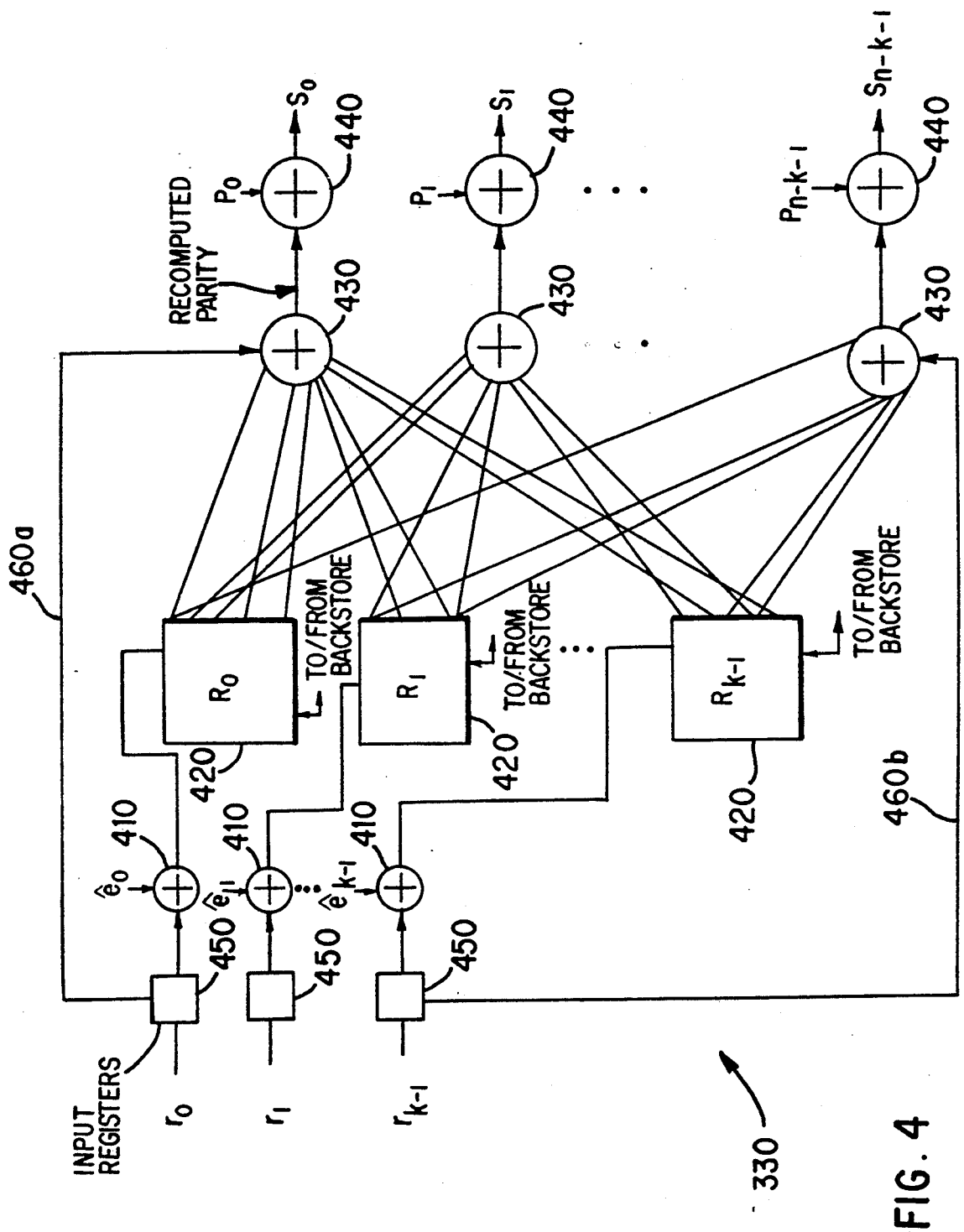
FIG. 4 is a detailed block diagram of the parity reencoder shown in FIG. 3.

FIG. 4 shows the parity reencoder 330 of FIG. 3 in detail. As shown, it comprises a number of input registers 450 corresponding to register 331 on FIG. 3. Data stored in input registers 450 is fed to summing nodes 410 corresponding to modulo-2 summers 332. The other input to the summers 410 is ê, an error pattern estimate corresponding to each of the input data bits $r_0 \ldots r_{k-1}$. The outputs of summers 410, that is, the corrected data, are supplied to shift registers 420 whence they are fed to further summers 430 corresponding to summer 335 of FIG. 3. Data in shift registers 420 (corresponding to shift register 333 of FIG. 3) is also supplied to backstore 334 as indicated. The ultimate recomputed parity bits output by summers 430 are supplied to summers 440 (corresponding to summers 336 of FIG. 3) where they are combined with the received parity bits, resulting in the syndrome bits $S_0 \ldots S_{n-k-1}$, all as indicated in FIG. 4.

FIG. 4 shows exemplary connections 460a, 460b which exist between certain outputs of the input registers 450 and certain summers 430. These connections are chosen in accordance with the block code which is employed in the particular design of the parity reencoder 330 according to the invention. That is, these connections determine the precise nature of the block code. The connections between registers 420 and sumers 430 are generated by computer analysis as suggested by Hagenauer, supra.

Figure 5A:
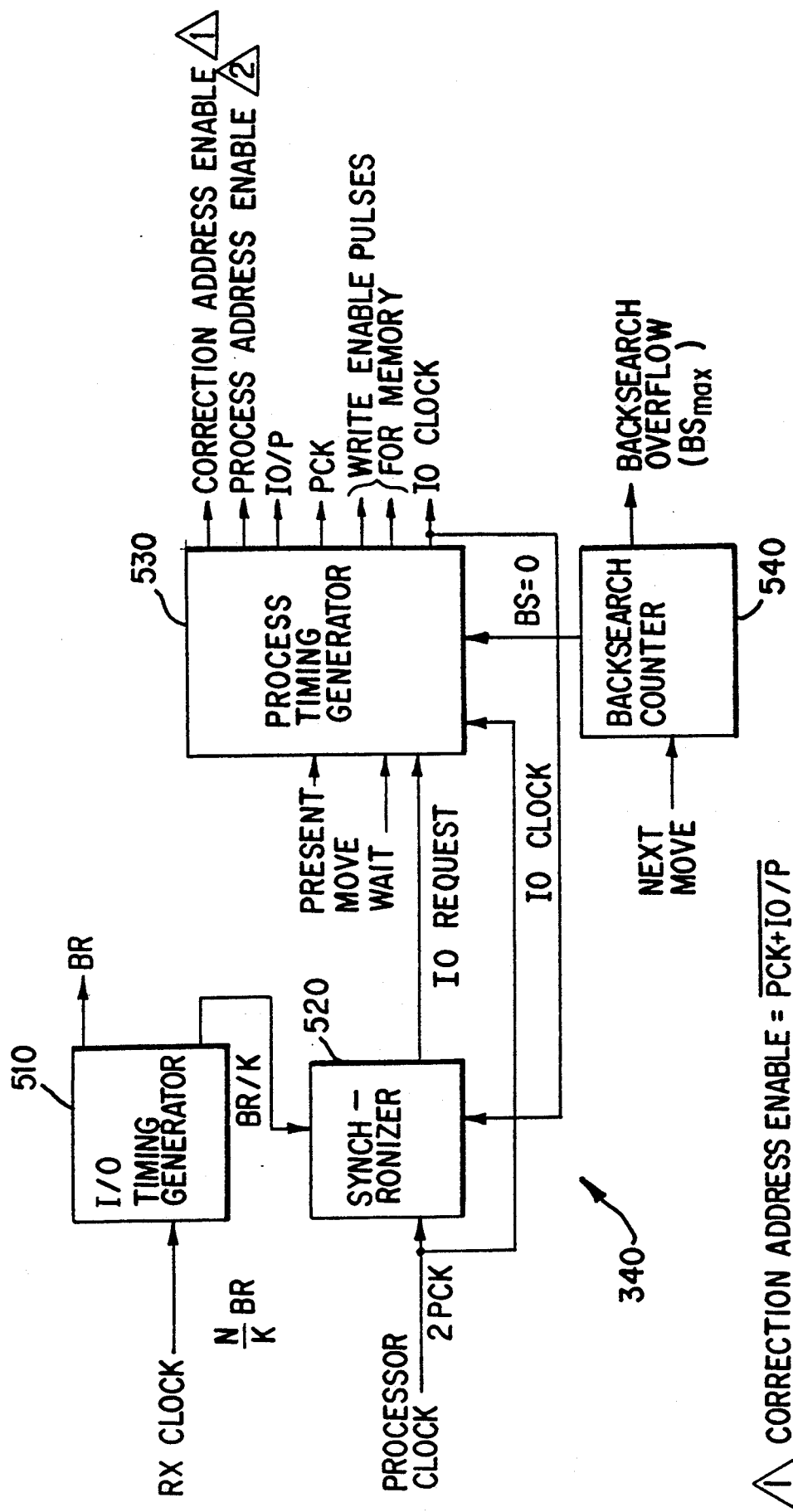
FIG. 5a is a detailed block diagram of the timing management unit shown in FIG. 3.
Figure 5B:
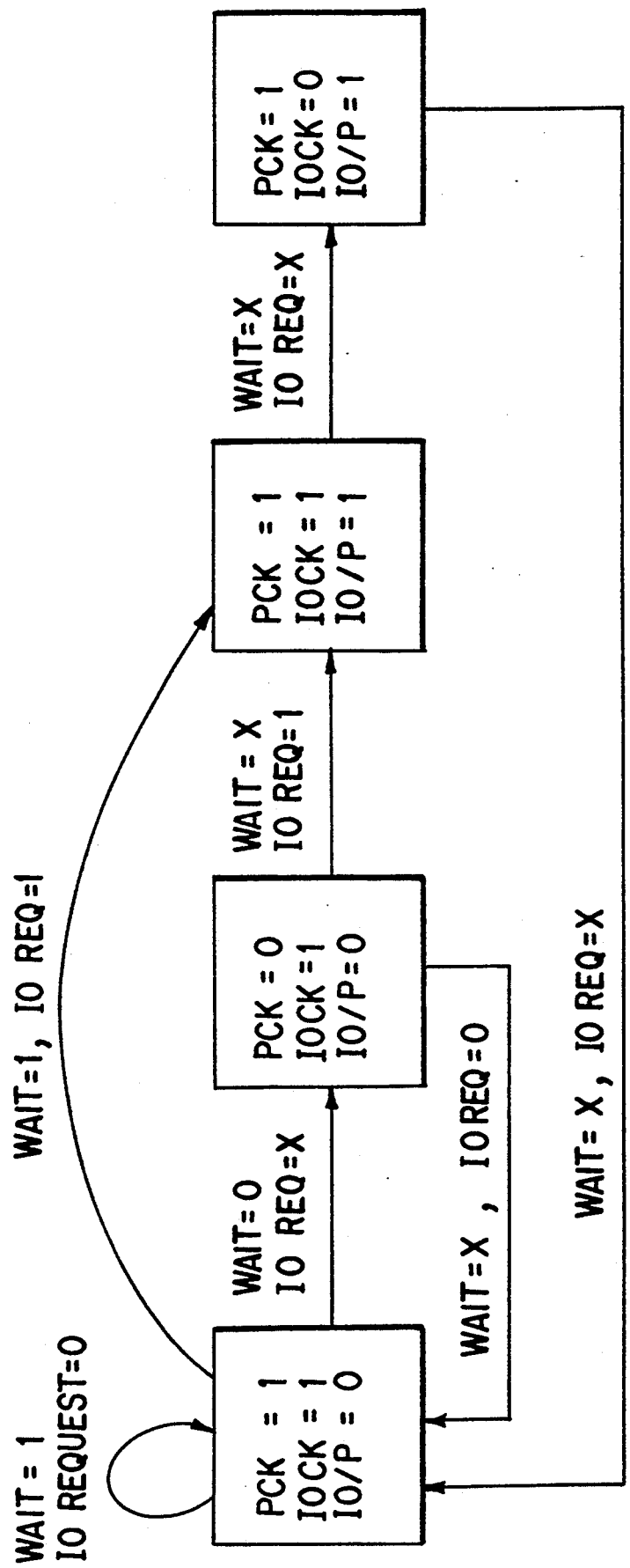

FIGS. 5a and 5b show detail of the timing management unit 340 of FIG. 3. FIG. 5a shows a block diagram of the timing management unit 340 itself, while 5b shows a state diagram of the unit 340.

The timing management unit 340 generates the various timing signals required throughout the decoder. The incoming bit rate B is employed by I/O timing generator 510 to generate BR/k and BR clocks using phase-locked logic. Synchronizer 520 generates an IO request pulse every time the BR/k signal has completed its cycle. The IO request, however, is synchronized with a local clock signal provided by local clock 345 (FIG. 3). The process timing generator 530 is a state machine that generates the waveforms required by the decoder. The decoder has two distinct cycles. During the I/O cycle, data is brought in to the decoder and stored in mainstore 320, and taken from mainstore 320 and sent out. During the process cycle, data is processed in the parity reencoder 330, one branch per cycle. Ancillary functions are also performed, as will be described subsequently. The process timing generator 530 also generates other timing signals, which are described by the Boolean functions of the state signals shown in FIG. 5b.

The backsearch counter 540 is a bidirectional counter used to monitor the decoding process. Counter 540 decrements on forward moves to a minimum count of zero (holding on any subsequent forward moves), increments on backward moves, and holds on lateral moves. The purpose of this counter is twofold: (1) it assures that the decoder will not back up beyond the limits of backstore 334, in which case a flag is sent to the Fano algorithm controller; (2) when the count is zero, the data at the output of backstore 334 is deemed valid and is transferred to mainstore 320. Otherwise the data in mainstore 320 is not overwritten.

Figure 6:
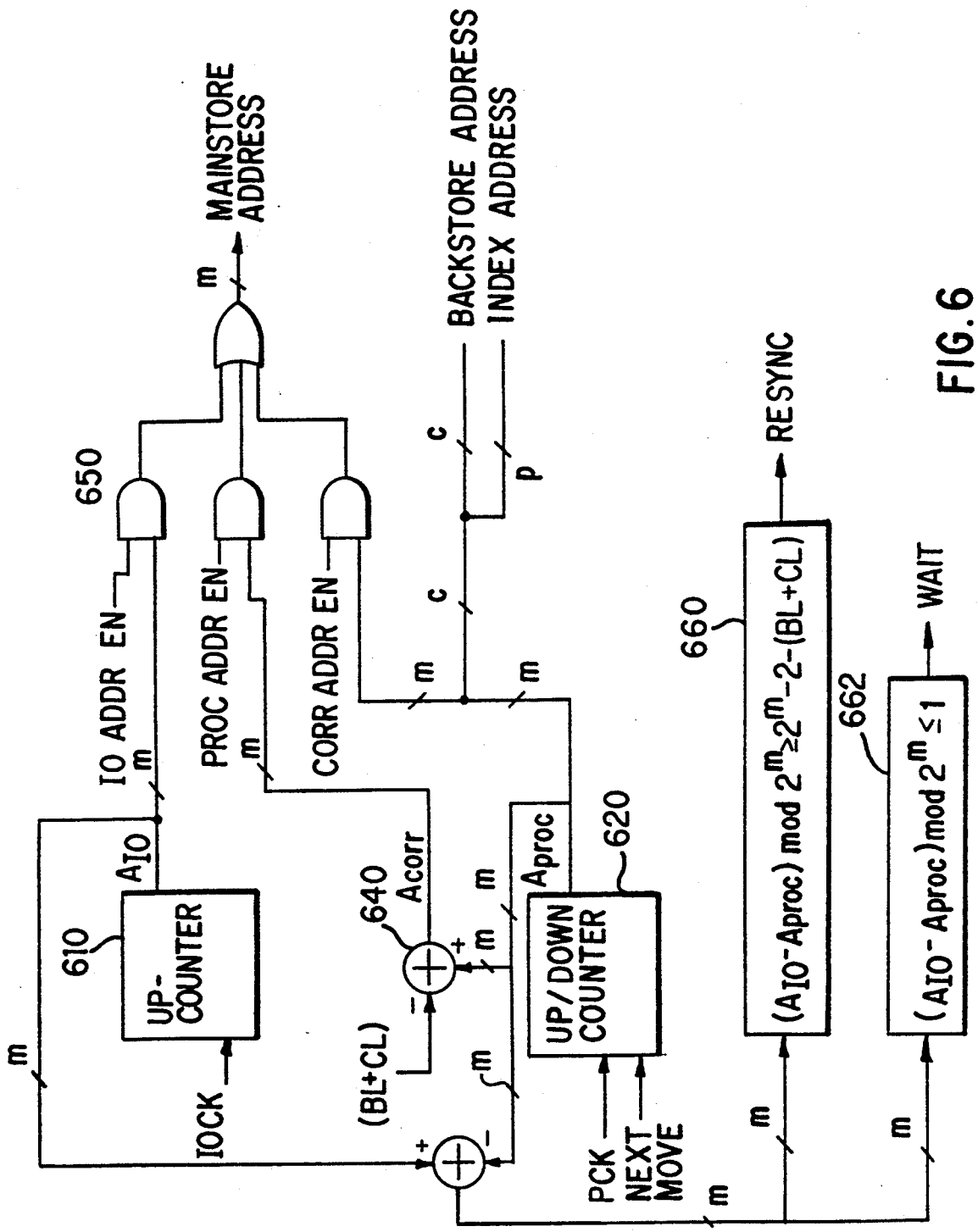
FIG. 6 is a detailed block diagram of the memory management unit shown in FIG. 3.

The memory management unit 350, which is detailed in FIG. 6, keeps track of the address pointers for the circular buffers in mainstore 320, backstore 334 and the index processor 360. An up-counter 610 increments on a signal IOCK (generated in the timing management unit 340, as shown in FIG. 5a) and generates the signal $A_{IO}$, the I/O input/output address. An up/down counter 620 changes with PCK (which is also generated by the timing management unit 340). The counter 620 is incremented upon forward moves, decremented with backward moves, and does not change with a lateral move. This counter 620 generates Aproc, the process address. Acorr, the correction address, is generated by subtracting (BL+CL), a constant, from Aproc in a binary two's complement adder 640. BL is the length of the back-search buffer and CL is the constraint length in number of branches. Then the mainstore address is selected from one of $A_{IO}$, Acorr or Aproc as shown, that is, in response to one of three possible enable signals. If the decoder runs out of time and must accept new data without fully decoding all previously received data, such that same data will not be fully corrected is generated by an arithmetic comparison, described at 660. A Wait signal is similarly generated at 662 when the decoder has caught up and needs to wait for new data.

Figure 7:
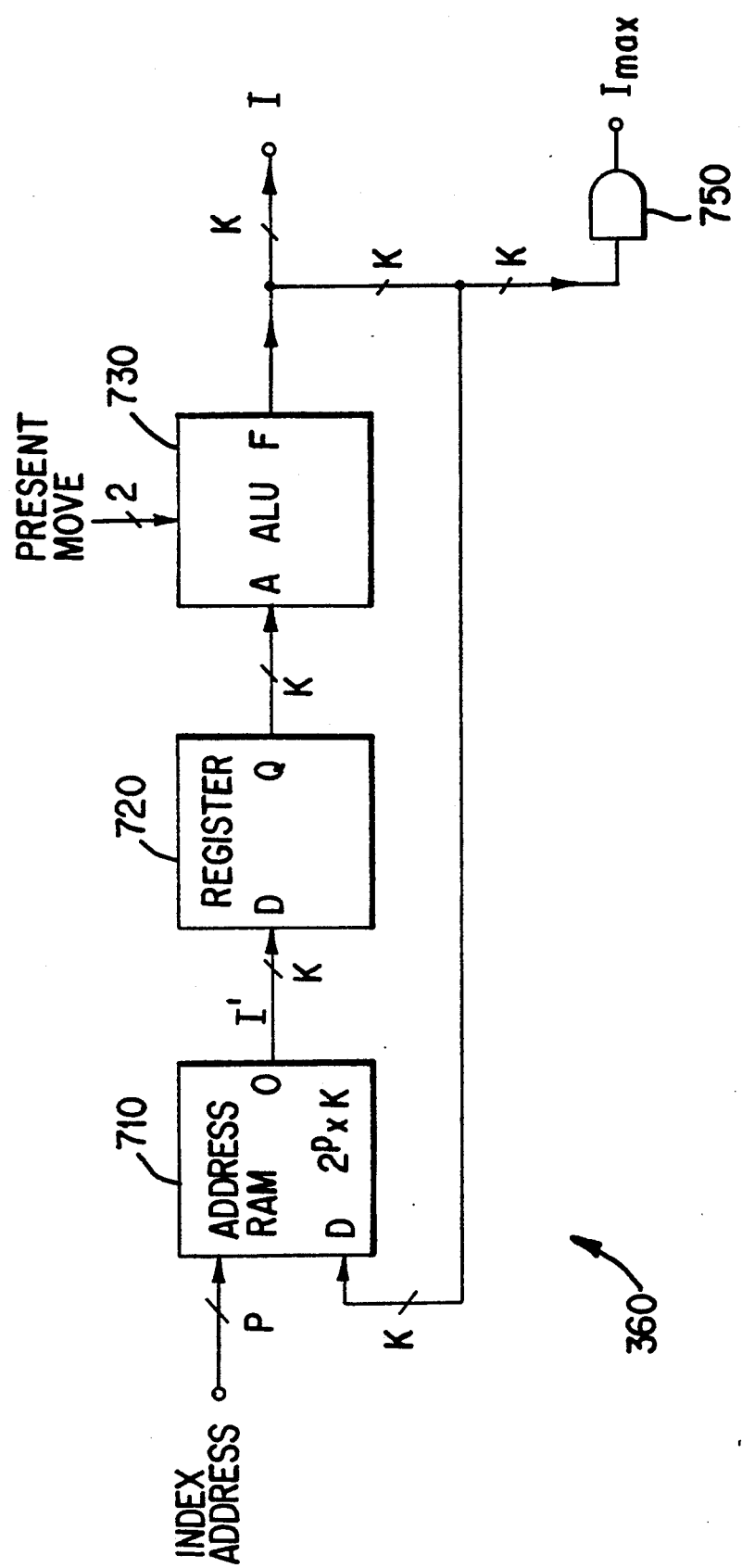
FIG. 7 is a detailed block diagram of the index processor shown in FIG. 3.

The index processor 360, which is detailed in FIG. 7, manages the Index, that is, records the number of lateral moves made for each of a number of most recent new nodes in the coding tree. At each node the no-error branch corresponds to an index of zero (i.e., no lateral moves were made). An arithmetic/logic unit 730 performs an arithmetic operation on the index recalled from storage 710 and 720 at each node, according to a prescribed set of rules. The index is incremented upon lateral moves, is set to zero upon forward moves, and is unchanged upon backward moves. When the index reaches its maximum count of $2^{k-1}$, a signal $I_{max}$ is generated by a Boolean operator 750. When $I_{max}$ is true, the decoder attempts no further lateral moves at the current node.

The Error Pattern Estimator (EPE) 370 and Branch Metric Generator (BMG) 375 operate as follows. The EPE can generate all possible $2^n$ error patterns. Best results at high speeds are achieved when the EPE 370 and BMG 375 are ROM's, organized as follows. Each syndrome vector is caused by one of $2^k$ error patterns. The probability that any one error pattern caused the syndrome vector s is a function of the channel crossover probabilities and thus a function of the quality vector The EPE 370 is then ordered so that for each s and for each g, the $2^k$ error patterns are in descending order of likelihood as the index i ranges from 0 to $2^k-1$. There are $2^{n-k}$ syndromes, so for each g there are $(2^{n-k})(2^k)=2^n$ error patterns. The EPE 370 has inputs s, g and i. The measure of the probability of the error patterns is the branch metric B, as described previously. The BMG 375 can then be a ROM with the same inputs as the EPE 370. The output of the BMG 375 is merely the B that corresponds to the output of the EPE 370 for the given inputs.

Figure 8:
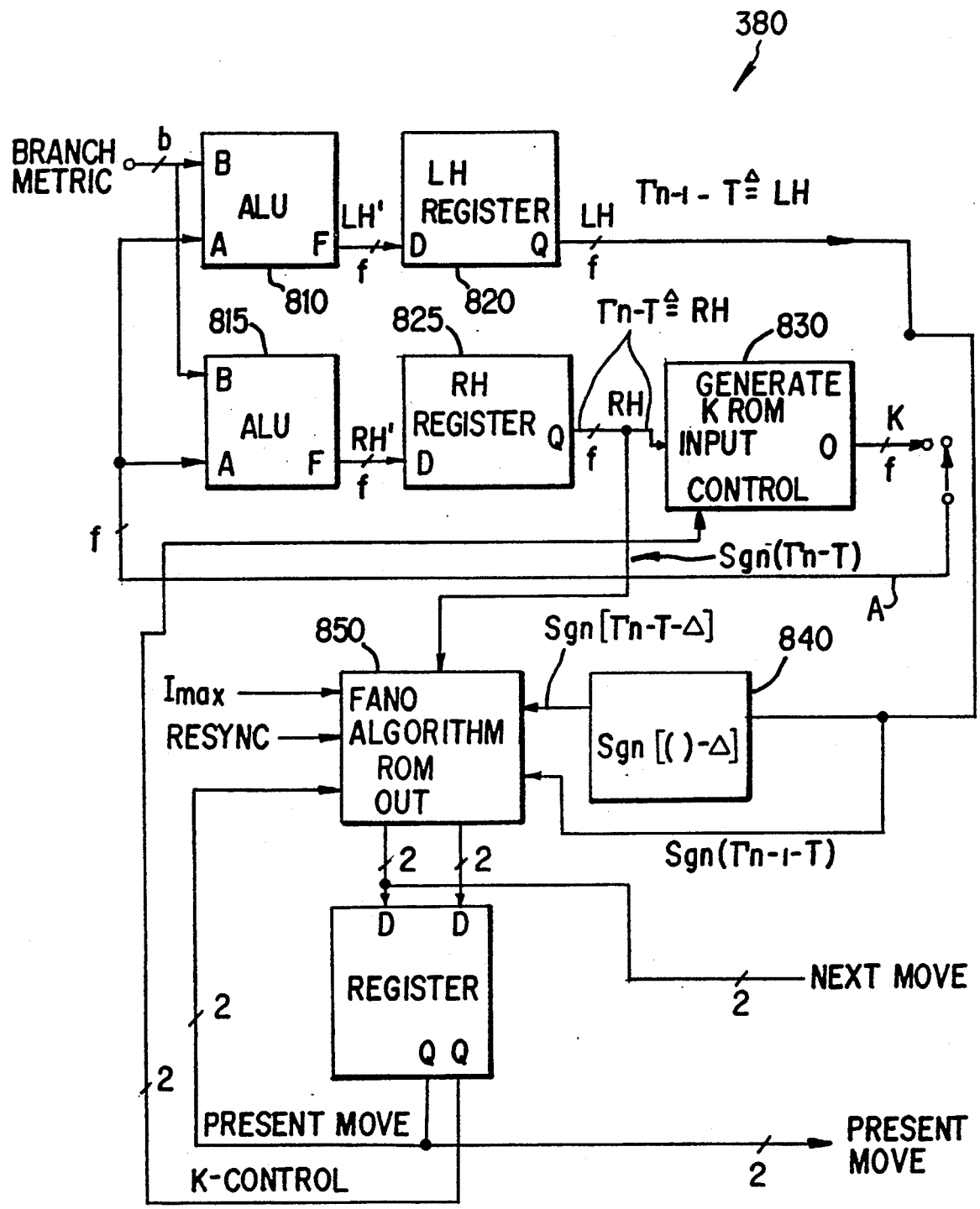
FIG. 8 is a detailed diagram of the Fano algorithm controller shown in FIG. 3.
Figure 9:
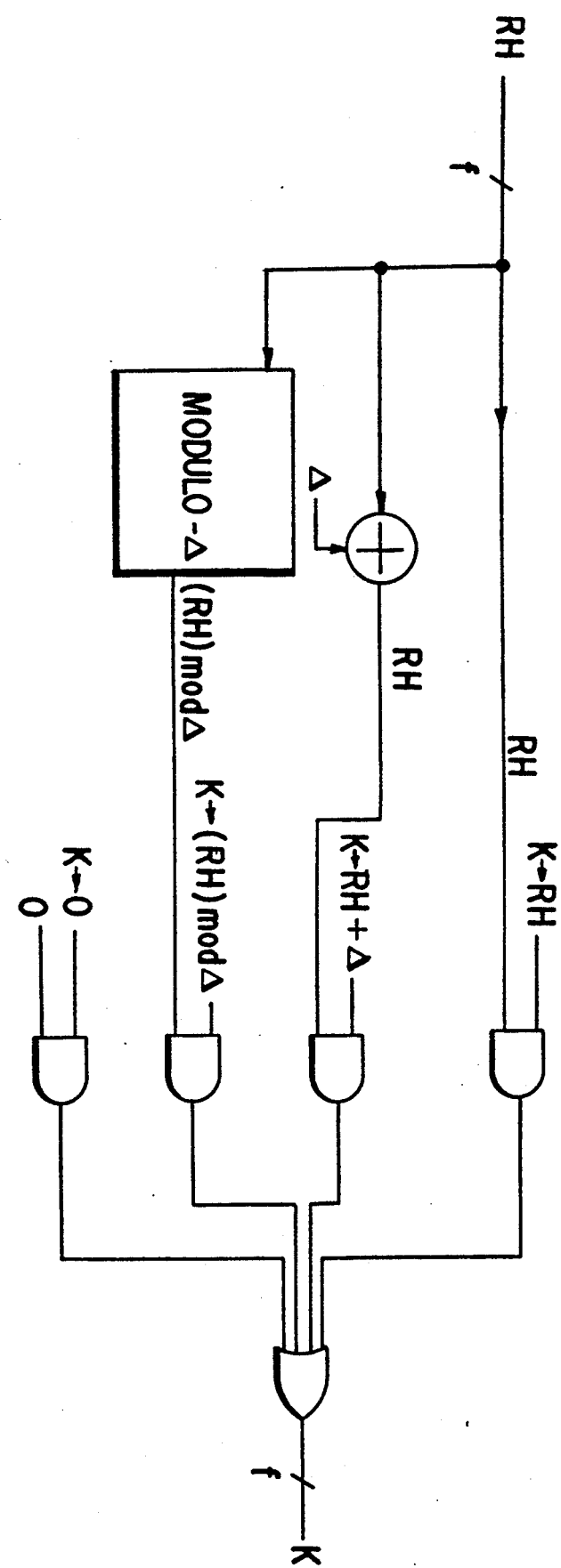
FIG. 9 shows a logical circuit equivalent of the function "Generate K" shown in FIG. 8.

The Fano algorithm controller 380 detailed in FIG. 8 forms a "next move" decision at each branch. The "next move" is either "forward", "lateral" or "backward", as described previously. The decisions are formed as follows. The branch metric B is fed to two arithmetic/-logic units 810 and 815. The "F" outputs of the two ALU's are the quantities LH' and RH'. The ALU's perform arithmetic operations on their inputs A and B according to Table I below in order to calculate LH' and RH'. Registers 820 and 825 output LH and RH, which are LH' and RH' after one clock delay. LH is then the path metric $\Gamma$ at node n-1, $\Gamma_{n-1}$, minus the running threshold T. RH is the path metric at node n, $\Gamma_n$, minus T. The Generate-K ROM 830 implements the logic shown in of the Boolean circuit in FIG. 9. The A input to the ALU's 810 and 815 is then selected according to Table I, given below. The sgn $[( )-\Delta]$ block 840 shown in FIG. 8 merely determines the sign of the quantity $LH-\Delta$, where $\Delta$ is the threshold spacing described previously and in the literature. See Clark and Cain, supra.

TABLE I

| Present Move | A | LH' | RH' |
|---|---|---|---|
| Forward | K | K | K + B |
| Lateral | LH | LH-B | LH |
| Backward | LH | LH | LH + B |

The Fano algorithm ROM 850 contains the rules for the Fano algorithm which are given in Table II below. (The term ROM includes the following devices: ROM, PROM, EPROM, EEPROM, PAL, FPLA, etc.; this memory element could also be composed of discrete logic elements.) Table II lists the Fano algorithm ROM 850 inputs as shown and provides two outputs as shown: the next move NM for the decoder and the control K for the Generate K ROM.

TABLE II

| | Fano Algorithm Rules | | | | | | | |
|---|---|---|---|---|---|---|---|---|
| | Inputs | | | | | | Outputs | |
| Rule | $C_{n-1}$ | $C_{n-1}$ | $C_n$ | PM | $I_{max}$ | $BS_{max}$ | Resync | NM | K |
| 1 | | 1 | | B | | | 0 | F | RH + $\Delta$ |
| 2 | | 0 | | B | 0 | | 0 | L | RH |
| 3 | | 0 | | B | 1 | 0 | 0 | B | RH |
| 4 | 0 | | 0 | F | | 0 | 0 | F | RH |
| 5 | 0 | | 0 | L | | 0 | 0 | F | RH |
| 6 | 1 | | 0 | F | | 0 | 0 | F | RHmod$\Delta$ |
| 7 | 1 | | 0 | L | | 0 | 0 | F | RHmod$\Delta$ |
| 8 | | | 1 | F | | 0 | 0 | B | RH |
| 9 | | | 1 | L | | 0 | 0 | B | RH |
| 10A | | | | F | | 1 | 0 | F | 0 |
| 10B | | | | B | 1 | 1 | 0 | F | 0 |
| 11 | | | | L | | 1 | 0 | F | 0 |
| 12 | | | | | | | 1 | F | 0 |

Inputs not shown are "don't care"

While a preferred embodiment of the invention has been shown and described, it will be appreciated that there are numerous modifications and departures therefrom which can be made without departing from the spirit and scope of the invention, which is intended to be encompassed only by the following claims.

We claim:

1. An encoder/decoder pair for use in a communication system, said encoder comprising means for encoding data according to a convolutional code and according to a block code, and said decoder comprising means for determining the number of transmission errors in a particular quantity of data received from said encoder, means for correcting errors up to a minimum predetermined number t of errors in blocks of data using said block code, and means for correcting greater than t errors in said quantities of data by employment of sequential decoding.

2. The encoder/decoder pair of claim 1 wherein said correction of greater than t errors is performed using the Fano algorithm.

3. The encoder/decoder pair of claim 1 wherein said block code is a t-error correcting code.

4. The encoder/decoder pair of claim 1 wherein said means for determining the number of transmission errors in a particular quantity of data received from said encoder is operated responsive to the conjunction of a parity-based examination of the data received from said encoder and soft decision levels.

5. A convolutional encoder and sequential decoder pair for use in a communication system,
wherein said convolutional encoder comprises:
means for generating parity bits and adding said parity bits to the data to be transmitted, said parity bits being generated jointly by employment of a convolutional code and a block code;
and said sequential decoder comprises:
means for performing block code error detection and correction using parity bits added to said data to be transmitted, wherein said block code error detection and correction means can correct up to t errors per given block of data, and means for performing, using sequential decoding, additional convolutional error detection and correction when more than t errors are detected by the convolutional ends to exist in a particular block of data.

6. The encoder/decoder pair of claim 5, wherein said means for performing convolutional error detection and correction employs the Fano algorithm.

7. The encoder/decoder pair of claim 6, wherein said sequential decoder comprises an error pattern estimator and branch metric generator which define all possible error patterns which may be encountered with respect to any communications channel employed.

8. The encoder/decoder pair of claim 7, wherein said sequential decoder calculates reconstructed parity bits using parity generation means essentially identical to the parity generation means comprised by the encoder and comprises comparison means for comparing the reconstructed parity bits to the parity bits transmitted together with the data to be transmitted, and syndrome generation means responsive to the output of said comparison means for generating syndrome bits employed to correct the data received from said encoder.

9. The encoder/decoder pair of claim 8, wherein said parity bits reconstructed at the decoder are generated by convolutional operation on a plurality of blocks of data received by said decoder from said channel.

10. An encoder/decoder pair for use in a communication system, said encoder comprising means for encoding data according to a convolutional code and according to a block code, and said decoder comprising means for determining the number of transmission errors in a particular quantity of data received from said encoder, means for detecting and correcting errors up to a minimum predetermined number t of errors in blocks of data using said block code, and means for detecting and correcting greater than t errors in said quantities of data by employment of the convolutionally-coded nature of the data.

11. The encoder/decoder pair of claim 10 wherein said correction of greater than t errors is performed using the Fano algorithm.

12. The encoder/decoder pair of claim 10 wherein said block code is a t-error correcting code.

13. The encoder/decoder pair of claim 10 wherein said means for determining the number of transmission errors in a particular quantity of data received from said encoder is operated responsive to the conjunction of a parity-based examination of the data received from said encoder and soft decision levels.

14. A convolutional encoder and sequential decoder pair for use in a communication system, wherein:
said convolutional encoder comprises:
means for generating parity bits and adding said parity bits to the data to be transmitted, said parity bits being generated jointly by employment of a convolutional code and a block code; and
said sequential decoder comprises:
means for performing block code error detection and correction using parity bits added to said data to be transmitted, wherein said block code error detection and correction means can correct up to t errors per given block of data, and means for performing additional convolutional error detection and correction when more than t errors are detected by the convolutional code to exist in a particular block of data.

15. The encoder/decoder pair of claim 14, wherein said means for performing convolutional error detection and correction employs the Fano algorithm.

16. The encoder/decoder pair of claim 15, wherein said sequential decoder comprises an error pattern estimator and branch metric generator which define all possible error patterns which may be encountered with respect to any communications channel employed.

17. The encoder/decoder pair of claim 16, wherein said sequential decoder calculates reconstructed parity bits using parity generation means essentially identical to the parity generation means comprised by the encoder and comprises comparison means for comparing the reconstructed parity bits to the parity bits transmitted together with the data to be transmitted, and syndrome generation means responsive to the output of said comparison means for generating syndrome bits employed to correct the data received from said encoder.

18. The encoder/decoder pair of claim 17, wherein said parity bits reconstructed at the decoder are generated by convolutional operation on a plurality of blocks of data received by said decoder from said channel.

* * * * *